(12) United States Patent
Baxley et al.

(10) Patent No.: US 6,493,544 B1
(45) Date of Patent: Dec. 10, 2002

(54) FM SIGNAL QUALITY DETECTOR DURING SEEK

(75) Inventors: Ronald G. Baxley, Ardmore; Ovetta Hobson, Madison, both of AL (US); Edwin Kammerer, Grossmehring (DE)

(73) Assignees: DaimlerChrysler Corporation, Auburn Hills, MI (US); Temic Multimedia Components, Inc., Irving, TX (US)

( * ) Notice: Subject to any disclaimer, the term of this patent is extended or adjusted under 35 U.S.C. 154(b) by 989 days.

(21) Appl. No.: 08/715,815

(22) Filed: Sep. 16, 1996

Related U.S. Application Data

(60) Provisional application No. 60/017,775, filed on May 15, 1996.

(51) Int. Cl.[7] .................................................. H04B 1/18
(52) U.S. Cl. .............................. 455/161.1; 455/164.1; 455/226.2
(58) Field of Search ..................... 455/161.1, 161.2, 455/161.3, 164.1, 164.2, 184.1, 226.2

(56) References Cited

U.S. PATENT DOCUMENTS

| | | | |
|---|---|---|---|
| 3,947,774 A | 3/1976 | Glennon et al. | 325/470 |
| 4,367,558 A | 1/1983 | Gercekci et al. | 455/164 |
| 4,406,018 A | 9/1983 | Motohashi | 455/164 |
| 4,503,513 A | 3/1985 | Pogue, Jr. | 364/900 |
| 4,556,987 A | 12/1985 | Schlösser et al. | 455/161 |
| 4,580,285 A | 4/1986 | Richards, Jr. | 455/161 |
| 5,073,975 A | 12/1991 | Zarabadi et al. | 455/161 |
| 5,125,105 A | * 6/1992 | Kennedy et al. | 455/226.2 |
| 5,197,084 A | 3/1993 | Fuhrman | 375/88 |
| 5,428,826 A | 6/1995 | Masaki | 455/161.2 |
| 5,457,816 A | 10/1995 | Koyama | 455/161.2 |
| 5,483,689 A | 1/1996 | O'Donnell, Jr. et al. | 455/200.1 |

* cited by examiner

Primary Examiner—Lee Nguyen
(74) Attorney, Agent, or Firm—Ralph E. Smith

(57) ABSTRACT

A vehicle radio includes a microprocessor-controlled tuner having a seek function. The tuner generates a station detect signal when a sufficiently strong signal is received, and the tuner also generates a multipath detect signal when a received signal exhibits undesirable multipath or adjacent channel conditions. To avoid ending the seek function when a relatively strong but poor-quality sideband signal is received, the microprocessor waits about 200 milliseconds after the station detect signal is generated, then determines whether the multipath detect signal is present, and if so, allows the seek to continue. On the other hand, the multipath detect signal can be expected to indicate that no multipath conditions exist (and, hence, that a good station signal exists) about 200 milliseconds after receipt of a good station signal, in which case the seek is terminated.

19 Claims, 2 Drawing Sheets

FM SIGNAL QUALITY DETECTOR DURING SEEK

This application is a United States Patent Application based on United States Provisional Patent Application Ser. No. 60/017,775 filed May 15, 1996, priority to which is claimed.

FIELD OF INVENTION

The present invention relates generally to vehicle radios, and more particularly to vehicle radios having station seek functions.

BACKGROUND OF THE INVENTION

A feature of many vehicle radios is the so-called station seek function, wherein a "seek" switch on the radio can be manipulated by a user to cause the radio tuner to automatically change its frequency setting from the current setting to the station frequency closest to the current setting. In other words, by simply depressing the "seek" button, a user of such a radio can cause the radio to automatically "find" the station closest to the current station, without requiring the user to rotate a tuner dial and essentially to audibly hunt for the next station. It will readily be appreciated that a seek function is particularly useful in vehicle applications, wherein the user might also be the driver and consequently someone whose manipulation of accessories such as radios is preferably minimized, to prevent unduly distracting the driver from his primary task.

Typically, when a radio's user manipulates a seek switch, the tuner begins to sweep its frequency, monitoring the received signal amplitude as it does so. When the received signal amplitude is greater than a predetermined threshold (indicating receipt of a station), the tuner stops sweeping. Thus, any signal having an amplitude greater than the threshold will stop the seek function on that signal.

Most of the time the radio will stop on the center frequency of a radio station. It happens, however, that a particularly strong station, in addition to having a strong signal at its center frequency, can also produce relatively strong signals on so-called sideband channels. Also, an interfering signal can be caused by a signal from a relatively weak station that is near the center frequency of a stronger station, i.e., a sideband signal or sideband channel noise can be caused by a weak station. In either case, when the sideband signals are sufficiently strong, a radio in a seek function can be caused to stop on the sideband, before the center frequency is reached. This is undesirable, because sideband signals, while carrying some useful information, typically carry a great deal of unpleasant noise. Consequently, when a radio tuner stops on a sideband, the user must reinitiate the seek function (or manually tune the radio) to cause the radio to be tuned to the center frequency, which is much more pleasant to listen to.

As recognized by the present invention, however, it is possible to cause a radio to continue seeking a "listenable" station (i.e., a station with relative signal clarity) upon reception of a sideband signal that would otherwise be sufficiently strong to terminate the seek on the sideband, regardless of whether the sideband is caused by the station or another weaker station broadcasting on a sideband frequency. Accordingly, it is an object of the present invention to provide a system for causing a radio in which a seek function has been invoked to continue sweeping its frequency past channels that contain large amounts of sideband noise. Another object of the present invention is to provide a method and apparatus for causing a radio to ignore sideband signals during seek, without requiring the addition of hardware to the radio. Yet another object of the present invention is to provide a method and apparatus for causing a radio to ignore sideband signals during seek that is easy to use and cost-effective.

SUMMARY OF THE INVENTION

A radio includes a tuner that has a station seek function. In turn, the tuner includes a station detect circuit for generating a station detect signal having either a true condition or a false condition. Furthermore, the tuner includes a multipath detect circuit for generating a multipath detect signal having either a true condition or a false condition. The radio also includes a microprocessor electrically connected to the tuner for receiving the station detect signal and multipath detect signal. When the station detect signal is true at a first time and when the multipath detect signal is false at a second time, the microprocessor causes the tuner to terminate the seek function. In accordance with the present invention, the second time is a predetermined time period, e.g., at least about 150 milliseconds and preferably about 200 milliseconds, after the first time.

Preferably, the tuner receives an input signal having an amplitude and one or more frequencies, and the station detect signal is true when the amplitude is greater than a predetermined amplitude. Additionally, the multipath detect signal is true when at least one of the frequencies (after demodulation and detection) is in a predetermined frequency band. In one preferred embodiment, the predetermined frequency band is from about sixty kiloHertz to about ninety kiloHertz (60 kHz–90 kHz). A vehicle incorporating the radio is also disclosed.

In another aspect of the present invention, a computer program device is used by a computer to end the seek function of a vehicle radio. As intended by the present invention, the program device is realized in a critical machine component that causes a computer to perform method steps to end the seek function. Stated differently, a machine component establishes a computer program product for ending a radio seek function. In accordance with the principles disclosed herein, the device can be implemented in logic means on a computer chip. Alternatively, the device can be implemented on an electrical circuit board, or in computer instructions on a machine-readable data storage medium.

The computer program device can include a logic means embodying instructions that are executable by the computer for ending a radio's seek function. The device includes logic means for determining whether a station signal has been detected, and, if a station signal has been detected at a first time, waiting a predetermined time period after the first time. Then, after the elapse of the predetermined time period, logic means determine whether the station signal exhibits multipath conditions. Per the present method the seek function is terminated if the station signal does not exhibit multipath conditions. A computer-implemented method using the above steps is also disclosed.

In yet another aspect, a tuning device is disclosed for a vehicle radio having a seek function. The tuning device receives an input station signal and generates a demodulated detected signal in response. The device includes a voltage discriminator for generating a first signal when the amplitude of the station signal exceeds a predetermined amplitude. Additionally, the tuning device includes a frequency band detector for generating a second signal when the demodulated detected signal is not characterized by a frequency in a predetermined frequency band. Moreover, processor means are included for terminating the seek function of the radio when the second signal is received a predetermined time period after the first signal is received.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
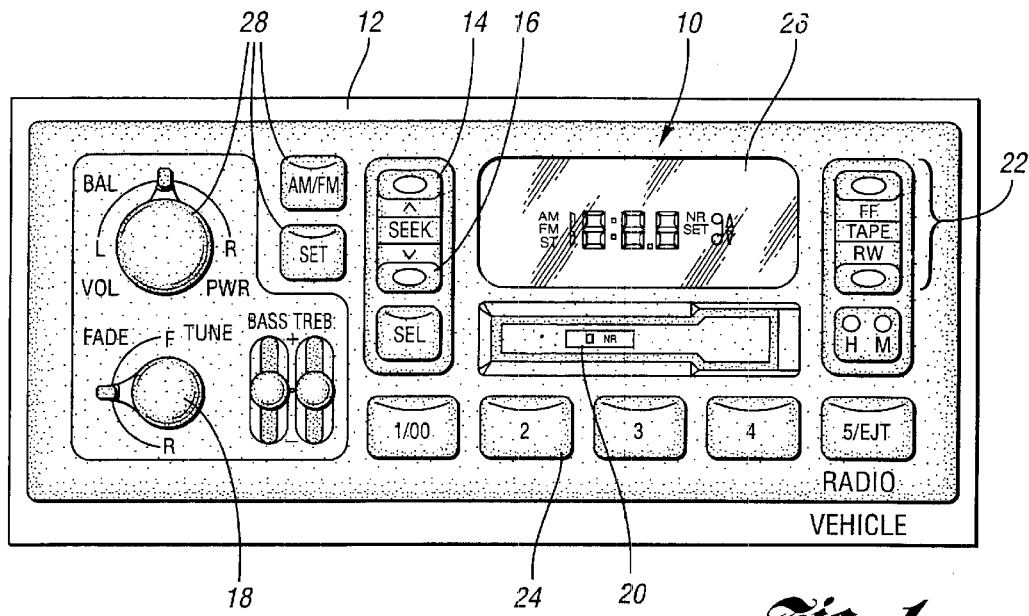
FIG. 1 is a schematic view of the radio of the present invention.

Referring initially to FIG. 1, a vehicle radio is shown, generally designated 10, that is installed in a vehicle 12. As shown, the radio 10 includes a manipulable seek up button 14 for causing the radio 10 to sweep its frequency upwardly until a station is detected. Also, the radio 10 includes a manipulable seek down button 16 for causing the radio 10 to sweep its frequency downwardly until a station is detected. Additionally, the radio 10 includes a tuner knob 18 that can be rotated by a person to manually tune the radio 10. If desired, the radio 10 can include ancillary features, such as a tape player 20 with controls 22, station memory controls 24, a clock 26, and various radio controls 28 in accordance with principles well-known in the art. In one preferred embodiment, the radio 10 is a Salas Code vehicle radio, part no. 4858556 made by Chrysler Corp.

Figure 2:
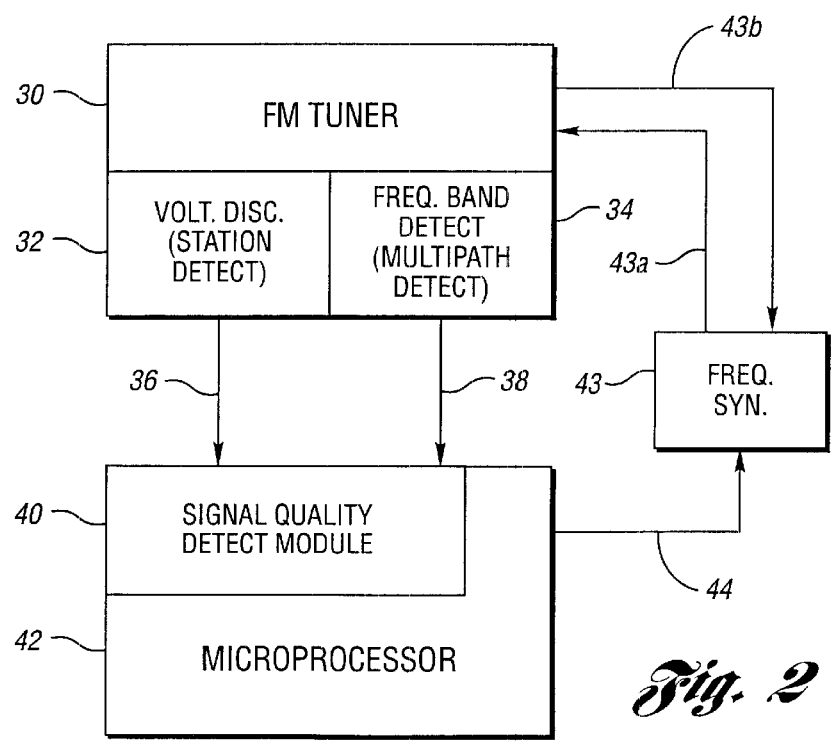
FIG. 2 is a block diagram of the tuning device of the present invention.

FIG. 2 shows that the radio 10 includes an FM tuner 30, preferably made by Temic of Germany and Dallas, Tex. and marketed as a "Model 1890" tuner. Per principles known in the art and mentioned above, the tuner 30 includes a station seek function, and when a user manipulates one of the seek buttons 14, 16, the tuner 30 sweeps its tuned frequency up or down, respectively, until criteria, including the novel criteria disclosed below, have been met for ending the seek function.

As shown in FIG. 2, the FM tuner 30 includes a voltage discriminator 32 and a frequency band detector 34. As those skilled in the art will readily appreciate, input signals to the FM tuner 30 are characterized by amplitudes and by one or more frequencies, and the input signals are sent to the voltage discriminator 32 (after the signals have been converted to intermediate frequencies, or "IF") and frequency band detector 34 (after both demodulating and decoding). Thus, per the present invention, the input signal to the voltage discriminator 32 is an IF signal, while the input signal to the frequency band detector 34 is an audible-range and, possibly, ultrasonic signal. It is to be understood that the signals are demodulated to IF and detected per radio principles known in the art.

The voltage discriminator 32 generates a station detect signal, represented by the line 36. When the amplitude of an input signal to the tuner 30 is greater than a predetermined amplitude, the voltage discriminator 32 establishes the station detect signal 36 to be "TRUE", indicating that the received amplitude is greater than a predetermined amplitude. Otherwise, the voltage discriminator 32 establishes the station detect signal to be "FALSE". It is to be understood that the voltage discriminator 32 establishes the station detect signal 36 in accordance with voltage discrimination principles well-known in the art. Stated differently, the voltage discriminator 32 establishes a station detect circuit for generating a station detect signal having either a true condition or a false condition.

Moreover, the frequency band detector 34 generates a multipath detect signal, represented by the line 38, which, like the station detect signal 36, is either "TRUE" or "FALSE". In the preferred embodiment, the frequency band detector 34 establishes the multipath signal 38 based upon the frequency or frequencies of the input signal (after demodulation and decoding). More particularly, the frequency band detector 34 is a bandpass filter that operates in accordance with principles well-known in the art to cause the multipath detect signal 38 to be "TRUE" when the input signal has a frequency in a predetermined frequency band, and otherwise to be "FALSE". It is to be understood that while the frequency band detector 34 establishes the multipath detect signal 38 using frequency as a discriminating quality, other means known in the art to generate multipath detect signals may be used. In other words, the frequency band detector 34 establishes a multipath detect circuit for generating a multipath detect signal having either a true condition or a false condition.

In the presently preferred embodiment, the predetermined frequency band is based on the demodulated, detected input signal, and is between about sixty kiloHertz and ninety kiloHertz (60 kHz–90 kHz). In a particularly preferred embodiment, the frequency band detector 34 establishes the multipath detect signal 38 to be "TRUE" when the input signal to the frequency band detector 34 includes a frequency of about eighty kiloHertz (80 kHz). As recognized by the present invention, the presence of such frequencies in the input signal indicates distortion products that in turn indicate the presence of multipath conditions or adjacent channel sidebands.

As shown in FIG. 2, the station detect signal 36 and multipath detect signal 38 are sent to a signal quality module (SQM) 40 of a microprocessor 42 of the radio 10 for processing as further described below. As also shown, the microprocessor 42 is connected to a frequency synthesizer 43 via a line 44, for sending a desired frequency signal to the synthesizer 43.

Per the preferred embodiment, the frequency synthesizer 43 is a conventional frequency synthesizer which outputs a voltage on a line 43a to the tuner 30. Additionally, the synthesizer 43 adjusts the output voltage on line 43a in response to a feedback signal from the tuner 30 on a feedback line 43b, as necessary to cause the tuner 30 to be tuned to the desired frequency output by the microprocessor 42 on the line 44 using so-called phase locked loop (PLL) radio tuning. As envisioned by the novel present invention and explained in detail below, the signal quality module (SQM) 40 establishes the desired frequency signal on the line 44 based on the station detect signal 36 and multipath detect signal 38 as appropriate to cause the frequency synthesizer 43 to terminate seek or to continue seek.

It is to be understood that the SQM 40 is implemented on a device medium. In the presently preferred embodiment, the device medium is implemented by logic circuits in the microprocessor 40. Alternatively, the SQM 40 can be implemented by a circuit board (not shown), and the operative components of the SQM 40 accordingly would be electronic components on the circuit board.

It is to be still further understood that the operations of the SQM 40 described below in reference to FIG. 4 could be embodied in machine-readable form and stored on a computer program storage device, such as the computer floppy diskette 46 shown in FIG. 3. In other words, FIG. 4 illustrates the structure of the SQM of the present invention as might be embodied in computer program software stored on the diskette 46 shown in FIG. 3. Those skilled in the art will appreciate that FIG. 4 illustrates the structures of computer program code elements that function according to this invention. Manifestly, the invention is practiced in its essential embodiment by a machine component that renders the computer program code elements in a form that instructs a digital processing apparatus (that is, a computer) to perform a sequence of function steps corresponding to those shown in the Figures.

Figure 3:
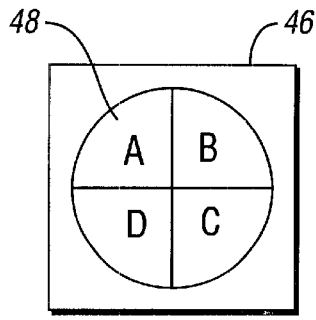
FIG. 3 is a schematic diagram of a program storage device.
Figure 4:
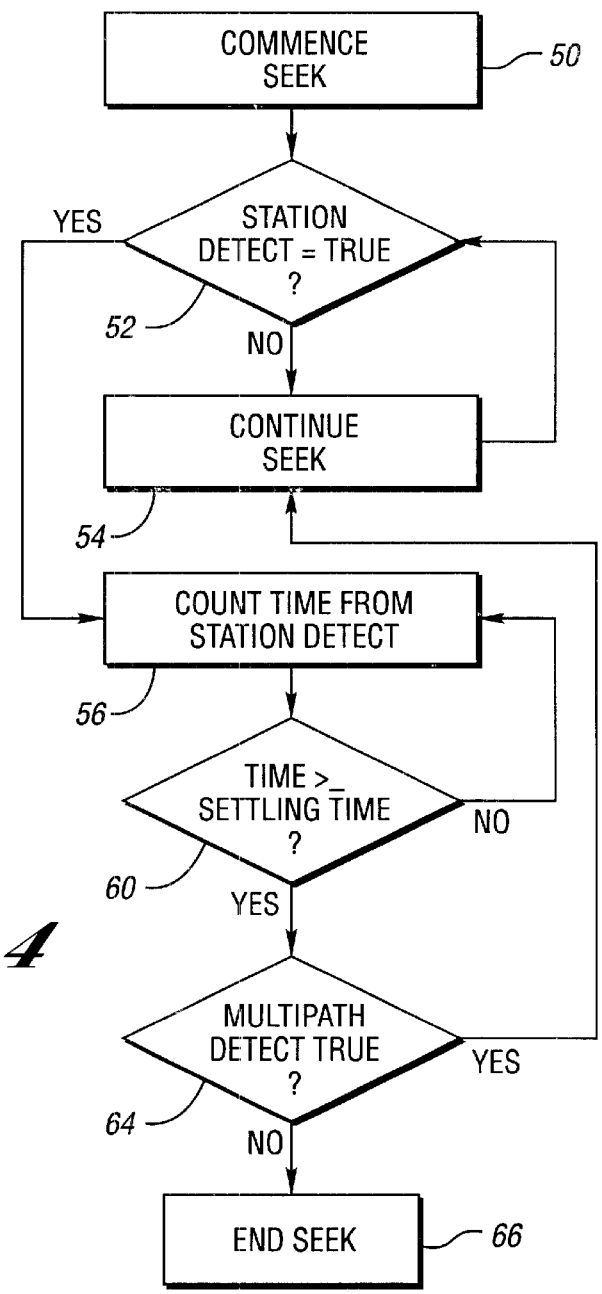
FIG. 4 is a flow chart showing the logic of the present invention.

These instructions may reside on a program storage device including a data storage medium, such as the computer floppy diskette 46 shown in FIG. 3. The machine component is shown in FIG. 3 as a combination of program code elements A–D in computer readable form that are embodied in a computer-usable data medium 48, on the computer diskette 46. Alternatively, as disclosed above such media can also be found in semiconductor devices, on magnetic tape, on optical disks, on a DASD array, on magnetic tape, on a conventional hard disk drive, on electronic read-only memory or on electronic random access memory, or other appropriate data storage device. In an illustrative embodiment of the invention, the computer-executable instructions may be lines of compiled C language code.

Now referring to FIG. 4, the operation of the present invention can be seen. As shown, at block 50 a user can initiate the seek function of the radio 10 by manipulating one of the buttons 14, 16 (FIG. 1). This causes the tuner to begin sweeping its frequency. As it does so, at decision diamond 52 the SQM 40 determines whether the station detect signal 36 is "TRUE". If not, the SQM 40 moves to block 54 to allow the seek function to continue, looping back to decision diamond 52 to repeat the test.

On the other hand, if, at decision diamond 52, it is determined that the station detect signal 36 is "TRUE", the SQM 40 proceeds to block 56. At block 56, the SQM 40 begins to count the elapsed time from reception of the "TRUE" station detect signal 36.

Moving to decision diamond 60, the SQM 40 determines whether the elapsed time is at least equal to a predetermined settling time period. If not, the SQM 40 loops back to block 56, but otherwise proceeds to decision diamond 64. Preferably, the predetermined time period is at least about one hundred fifty milliseconds (150 ms), and more preferably the predetermined time period is two hundred milliseconds (200 ms).

As shown in FIG. 4, at decision diamond 64 if the multipath detect signal 38 is "TRUE" the SQM 40 loops back to block 54 to continue the seek function. On the other hand, if, at decision diamond 64, the multipath detect signal 38 is "FALSE", the SQM 40 moves to block 66 to terminate the seek function.

It may now be appreciated that the microprocessor 42 terminates the seek function when the station detect signal 36 is "TRUE" at a first time and when the multipath detect signal 38 is "FALSE" at a second time, wherein the second time is a predetermined time period, preferably 200 ms, after the first time. In other words, when a station signal has been detected, the microprocessor 42 waits about 200 ms and then determines whether the station signal exhibits multipath conditions. As recognized by the present invention, if the station signal is a "good" signal and, hence, is neither a sideband signal nor another station signal that exhibits undesirable multipath characteristics, the multipath detect signal 38 will change from "TRUE" to "FALSE" after about 200 ms. As disclosed above, under these conditions the seek function is advantageously terminated.

In contrast, if the station signal is a sideband signal (or if the station signal is the center frequency of a station exhibiting undesirable multipath characteristics), the multipath detect signal 38 will remain "TRUE" after 200 ms. As disclosed above, under these conditions the present invention advantageously allows the radio 10 to continue seeking a "good" station, thereby avoiding terminating the seek function when a poor quality but nevertheless relatively strong signal is received.

While the particular FM SIGNAL QUALITY DETECTOR DURING SEEK as herein disclosed and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims.

We claim:

1. A radio, comprising:
   a tuner having a station seek function, the tuner including:
      a station detect circuit for generating a station detect signal having either a true condition or a false condition;
      a multipath detect circuit for generating a multipath detect signal having either a true condition or a false condition; and
   a microprocessor electrically connected to the tuner for receiving the station detect signal and multipath detect signal and terminating the seek function when the station detect signal is true at a first time and when the multipath detect signal is false at a second time, the second time being a predetermined time period after the first time.

2. The radio of claim 1, wherein the tuner receives an input signal having an amplitude, and the station detect signal is true when the amplitude is greater than a predetermined amplitude.

3. The radio of claim 2, wherein the multipath detect signal is true when the input signal after demodulating and decoding is characterized by one or more frequencies in a predetermined frequency band.

4. The radio of claim 3, wherein the predetermined frequency band is from about sixty kiloHertz to about ninety kiloHertz (60 kHz–90 kHz).

5. The radio of claim 1, wherein the predetermined time period is at least about one hundred fifty milliseconds (150 ms).

6. The radio of claim 5, wherein the predetermined time period is at least about two hundred milliseconds (200 ms).

7. A computer program device comprising:
   a computer program storage device readable by a digital processing system; and
   a program means on the program storage device and embodying logic means recognizable by the digital processing system for performing method steps for ending a station seek function of a radio, comprising:

logic means for determining whether a station signal has been detected;

logic means for waiting, if a station signal has been detected at a first time, a predetermined time period after the first time;

logic means for determining, after the elapse of the predetermined time period, whether the station signal exhibits multipath conditions; and logic means for terminating the station seek function if the station signal does not exhibit multipath conditions.

8. The device of claim 7, wherein the station signal is characterized by an amplitude and one or more detected frequencies, and the station signal is detected when the amplitude is greater than a predetermined amplitude.

9. The device of claim 8, wherein it is determined that the station signal exhibits multipath characteristics when at least one of the detected frequencies is about eighty kiloHertz (80 kHz).

10. The device of claim 9, wherein the predetermined time period is about two hundred milliseconds (200 ms).

11. The device of claim 10, wherein the device is implemented on a semiconductor chip.

12. The device of claim 10, wherein the device is implemented in computer instructions on a machine-readable data storage medium.

13. A computer-implemented method for ending a station seek function of a radio, comprising the steps of:

determining whether a station signal has been detected;

if a station signal has been detected at a first time, waiting a predetermined time period after the first time; then after the elapse of the predetermined time period, determining whether the station signal exhibits multipath conditions; and terminating the seek function if the station signal does not exhibit multipath conditions.

14. The method of claim 13, wherein the station signal is characterized by an amplitude and one or more detected frequencies, the station signal is detected when the amplitude is greater than a predetermined amplitude, it is determined that the station signal exhibits multipath characteristics when at least one of the detected frequencies is about eighty kiloHertz (80 kHz), and wherein the predetermined time period is about two hundred milliseconds (200 ms).

15. A vehicle, comprising:

a radio including a tuner having a station seek function, the tuner including a station detect circuit for generating a station detect signal having either a true condition or a false condition and a multipath detect circuit for generating a multipath detect signal having either a true condition or a false condition; and a microprocessor electrically connected to the tuner for receiving the station detect signal and multipath detect signal and terminating the seek function when the station detect signal is true at a first time and when the multipath detect signal is false at a second time, the second time being a predetermined time period after the first time.

16. The vehicle of claim 15, wherein the tuner receives an input signal having an amplitude, and the station detect signal is true when the amplitude is greater than a predetermined amplitude, and wherein the predetermined time period is at least about two hundred milliseconds (200 ms).

17. A tuning device for a vehicle radio having a seek function, the tuning device receiving an input station signal and generating a demodulated detected signal in response thereto, the device comprising:

a voltage discriminator for generating a first signal when the amplitude of the station signal exceeds a predetermined amplitude;

a frequency band detector for generating a second signal when the demodulated detected signal is not characterized by a frequency in a predetermined frequency band; and processor means for terminating the seek function of the radio when the second signal is received a predetermined time period after the first signal is received.

18. The tuning device of claim 17, wherein the predetermined frequency band is from about sixty kiloHertz to about ninety kiloHertz (60 kHz–90 kHz).

19. The tuning device of claim 18, wherein the predetermined time period is at least about one hundred fifty milliseconds (150 ms).

* * * * *